United States Patent
Shih et al.

(10) Patent No.: US 7,556,999 B2
(45) Date of Patent: Jul. 7, 2009

(54) METHOD FOR FABRICATING NON-VOLATILE MEMORY

(75) Inventors: Yen-Hao Shih, Hsinchu (TW); Erh-Kun Lai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 242 days.

(21) Appl. No.: 11/531,007

(22) Filed: Sep. 12, 2006

(65) Prior Publication Data

US 2008/0064158 A1    Mar. 13, 2008

(51) Int. Cl.
*H01L 21/8238* (2006.01)

(52) U.S. Cl. .................. 438/201; 438/211; 438/221; 257/262; 257/E21.409

(58) Field of Classification Search .......... 438/201, 438/211, 221, 223, 228; 257/262, E21.409, 257/E21.449
See application file for complete search history.

(56) References Cited

U.S. PATENT DOCUMENTS

| | | | |
|---|---|---|---|
| 4,375,999 A * | 3/1983 | Nawata et al. .............. 438/340 |
| 6,448,137 B1 * | 9/2002 | Lai et al. .................... 438/258 |
| 6,541,816 B2 | 4/2003 | Ramsbey et al. | |
| 6,610,586 B1 | 8/2003 | Liu | |
| 6,803,279 B2 | 10/2004 | Eitan | |
| 6,972,230 B1 * | 12/2005 | Pan et al. ................... 438/257 |
| 7,132,330 B2 * | 11/2006 | Kobayashi .................. 438/258 |
| 2004/0033664 A1 * | 2/2004 | Park ........................... 438/264 |
| 2006/0261398 A1 * | 11/2006 | Lee ............................ 257/314 |

OTHER PUBLICATIONS

U.S. Appl. No. 11/445,870, filed Jun. 2, 2006, Yen-hao Shih et al.

* cited by examiner

*Primary Examiner*—Phuc T Dang
(74) *Attorney, Agent, or Firm*—J.C. Patents

(57) ABSTRACT

A method for fabrication a memory having a memory area and a peripheral area includes forming a first gate insulating layer with a first thickness over a substrate of a first region in the peripheral area and a second insulating layer with a second thickness over the substrate of the memory region. Thereafter, a buried diffusion region is formed in the substrate of the memory area. A charge trapping layer and a third insulating layer are formed over the substrate. A gate insulating layer is formed in the second region in the peripheral area, wherein the first thickness is greater than a second thickness after removing the charge trapping layer and third insulating layer on the first and second region in the peripheral area. A conductive layer is formed over the substrate of the memory area and the peripheral area substantially after the gate insulating layer is formed.

25 Claims, 4 Drawing Sheets

METHOD FOR FABRICATING NON-VOLATILE MEMORY

BACKGROUND OF THE INVENTION

1. Field of Invention

The present invention relates to a method for fabricating a semiconductor device. More particularly, the present invention relates to a method for fabricating a non-volatile memory.

2. Description of Related Art

As the integration of semiconductor devices increases, the line width of the semiconductor devices must be reduced. However, as the size of the semiconductor devices, for example, memory devices decreases, a variety of problems is resulted. For example, as the line width of a memory device is reduced, the channel length between the source and the drain is correspondingly reduced, leading to the short channel effect.

Normally, a memory device integrates the memory cell arrays and the peripheral circuit elements onto a single chip. The peripheral circuit elements include high voltage (HV) devices and (LV) low voltage devices. The prior art method in forming such a memory device involves first forming a silicon oxide-silicon nitride-silicon oxide (ONO) composite structure in the memory array area, followed by forming the buried diffusion regions in the substrate adjacent to the ONO structure. The buried diffusion regions are formed by implanting dopants in the substrate. Thereafter, thermal oxidation processes are respectively performed to form the gate insulating layers for the high voltage devices and the low voltage devices in the peripheral circuit area.

According to the prior art fabrication method, subsequent to the formation of the buried diffusion regions in the memory array area, the high thermal budget processes, such as the fabrication of the thick gate insulating layers for the high voltage devices, can seriously affect the size of the buried diffusion region. In essence, the high temperature budget leads to an expansion of the buried diffusion regions. Consequently, the short channel effect is intensified. Further, the device may become defective.

To remedy the problems of diffusion junction expansion, a fabrication method has been proposed by forming thick gate insulating layer in the peripheral circuit area first, followed by the tunnel oxide in the memory array area and thin gate insulating layer in the peripheral circuit area. Buried diffusion regions are then formed by implanting ions in the substrate of the memory array area. Since the gate insulting layers are already formed in the peripheral circuit area, the size of the buried diffusion regions will not be affected by the high thermal budget processes. Thereafter, a silicon nitride layer and a top oxide layer are formed in both the memory array area and the peripheral circuit area to complete the formation of the ONO structure of the memory device. However, the silicon nitride layer and the top oxide layer in the peripheral circuit area have to be removed eventually. The removal of the silicon nitride layer and the top oxide layer, which requires the application of etchants such as hydrofluoric acid and hot phosphoric acid, may induce defects on the gate insulating layers underneath. Consequently, the quality of the devices in the peripheral circuit area is compromised. Defect control is especially critical for the LV gate insulating layer due to the delicate nature of the LV devices.

SUMMARY OF THE INVENTION

In view of the foregoing, the present invention provides a method for fabricating a non-volatile memory in which the expansion of the buried diffusion region is prevented. Ultimately, the short channel effect is mitigated and the device characteristics of the memory can be better controlled.

The present invention also provides a method for fabricating a non-volatile memory, wherein the gate insulating layer of the low voltage devices in the peripheral circuit area is obviated of defects. Consequently, the yield is improved.

As embodied and broadly described herein, the present invention provides a method for fabricating a non-volatile memory that includes forming a first insulating layer with a first thickness over a first region of the peripheral area, forming a tunnel oxide over the memory area and thereafter a buried diffusion region in the memory area. A charge trapping medium including a charge storage layer is subsequently formed over the memory area. Ultimately, a second insulating layer with a second thickness is formed over a second region of the periphery circuit area, wherein the first thickness of the first insulating layer is greater than the second thickness of the second insulating layer.

According to one aspect of the invention, the first insulating layer and the second insulating layer are gate dielectric films formed by methods including thermal oxidation, for example.

According to one aspect of the invention, a conductive layer is formed over the substrate substantially after the fabrication of the second insulating over the second region.

According to one aspect of the invention, the first region of the peripheral area is formed with high voltage devices, while the second region of the peripheral area is formed with low voltage devices.

According to one aspect of the invention, the first insulating layer is also formed over the memory area, wherein the first insulating layer in the memory area is subsequently removed, and a tunnel oxide is formed on the memory area before the buried diffusion region in the memory area is formed.

According to the one aspect of the invention, a first notch is formed in an isolation structure configured between the peripheral area and the memory area when the first insulating layer in the memory area is removed.

According to other aspect of the invention, the first insulating layer is also formed over the second region of the peripheral area, wherein the first insulating layer in the second region is removed before the second insulating layer in the second region of the peripheral area is formed.

According to the other aspect of the invention, a second notch is formed in an isolation structure configured between the first region and the second region when the first insulating layer in the peripheral area is removed.

According to yet another aspect of the invention, the charge trapping medium in the peripheral area is subsequently removed and an undercut of the charge storage layer is formed at the periphery of the memory area.

In the present invention, the fabrication of the gate dielectric film for the high voltage devices in the peripheral area is conducted before the formation of the buried diffusion region in the memory area. Therefore, the size of the buried diffusion region remains unaffected by the high thermal budget process used in forming the gate dielectric film of the transistors in the peripheral area. The expansion of the buried diffusion region is thus confined. Accordingly, the short channel effect can be minimized. Further, the device characteristics of the memory can be better controlled.

Moreover, the fabrication of the gate dielectric film for the low voltage devices is conducted after the formation of the charge trapping medium in the memory area and the formation of the gate dielectric film for the high voltage devices.

Further, a conductive layer is formed substantially after the fabrication of the gate dielectric film for the low voltage devices, covering the gate dielectric film of the low voltage devices. Accordingly, the gate dielectric film of the low voltage devices remains uncompromised by other processes of the fabrication of the memory device. Ultimately, the quality and the property of the low voltage devices can be better maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A-1H are cross-sectional views showing selected process steps for fabricating a memory comprising a memory array area and a corresponding peripheral circuit area in accordance to one embodiment of the invention.

Figure 1A:
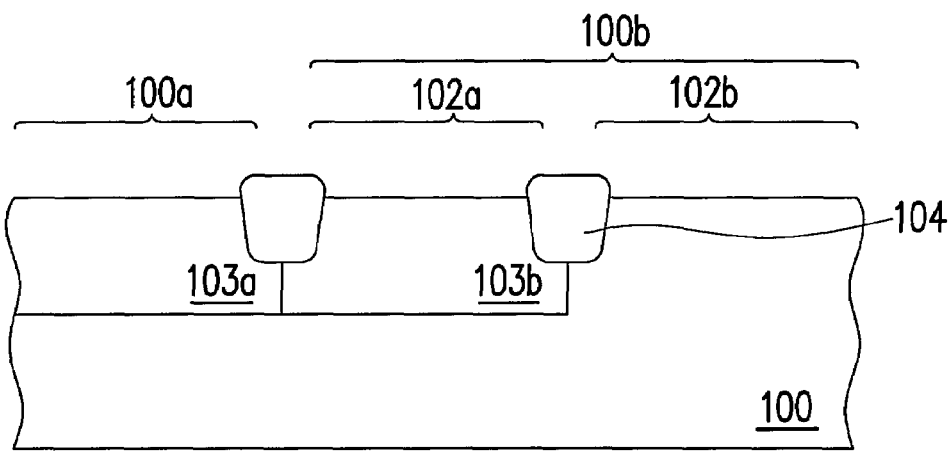
FIGS. 1A-1H are cross-sectional views showing selected process steps for fabricating a non-volatile memory comprising a memory array area and a corresponding peripheral circuit area in accordance to one embodiment of the invention.

Referring to FIG. 1A, a semiconductor substrate 100 is provided. The semiconductor substrate 100 may be a silicon wafer, for example. The surface of the semiconductor substrate 100 is divided into at least a memory array area 100a and a peripheral circuit area 100b formed adjacent to each other. The peripheral circuit area 100b may further divide into at least a high voltage device region (HV) 102a and a low voltage device region (LV) 102b. Additionally, wells 103a, 103b may also form in the memory array area 100a and the high voltage device region (HV) 102a, respectively. The wells 103a, 103b are formed by implanting dopants in the substrate 100, for example. The wells may be either an N-well for forming PMOS devices or P-well for forming NMOS devices. Further, isolation structures 104, for example, shallow trench isolation structures, are used to separate the different regions and areas.

Figure 1B:
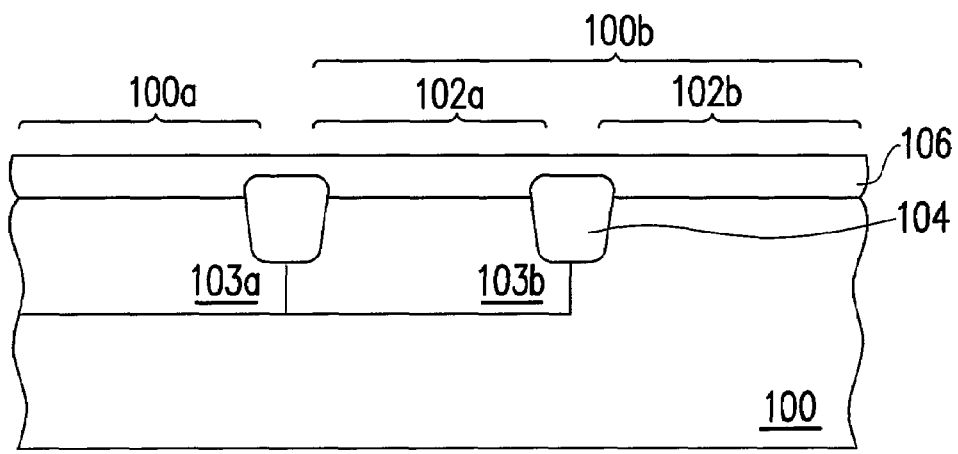

Referring to FIG. 1B, an insulating film 106 is to be provided on substrate 100 of the memory array area 100a and the peripheral circuit area 100b, including both the high voltage device region 102a and the low voltage device region 102b. The insulating film 106 is, for example, an oxide layer of about 150 to 170 angstroms thick. The insulating film 106 is formed by performing a thermal process in an oxidation furnace, for example. In one embodiment, the insulating film 106 serves as a gate dielectric film of the high voltage devices. In one embodiment, a cleaning process may perform to clean the substrate 100 before the formation of the insulating film 106.

Figure 1C:
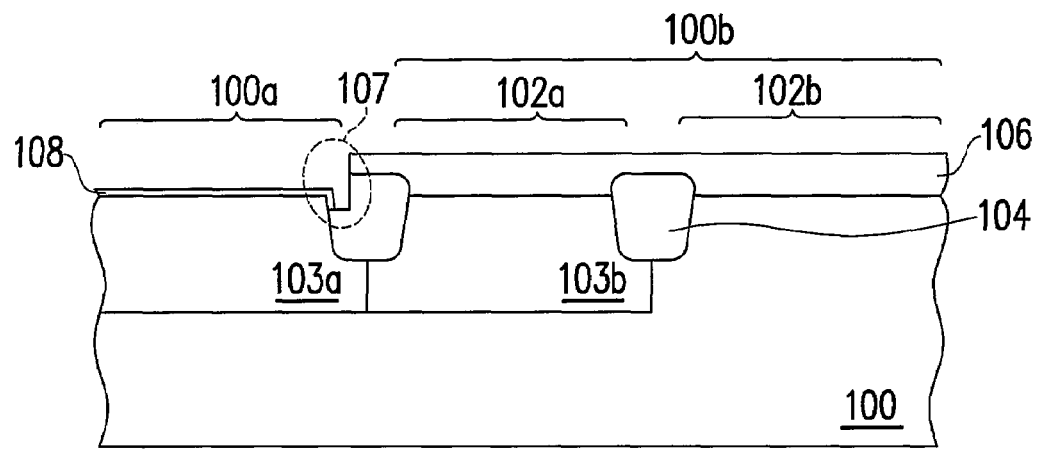

Referring to FIG. 1C, a patterned mask (not shown) is formed, wherein this patterned mask conceals the peripheral circuit area 100b while exposes the memory array area 100a. Using the patterned mask as an etching mask, the insulating film 106 in the memory array area 100a is removed. The insulating film 106 is removed by wet etching, for example, with etchant including but not limited to BOE (buffer oxide etchant) or hydrofluoric acid. The removal of the insulating film 106 may result with a notch 107 being formed at the top edge surface of the isolation structure 104 configured between the memory array area 100a and the peripheral circuit area 100b. Thereafter, an insulating film 108 is formed on the substrate 100 in the memory array area 100a. The insulating film 108, which serves as a tunneling oxide layer, is formed with silicon oxide to a thickness of about 50 to 100 angstroms, for example. One method of forming the insulating film 108 is by thermal oxidation, for example. In one embodiment, a cleaning process, for example, a pre-gate oxide cleaning process may perform to clean the substrate 100 before the formation of the insulating film 108. In one embodiment, the insulating film 106 in the high voltage device regions 102a and 102b may concurrently provide with an additional thickness.

Figure 1D:
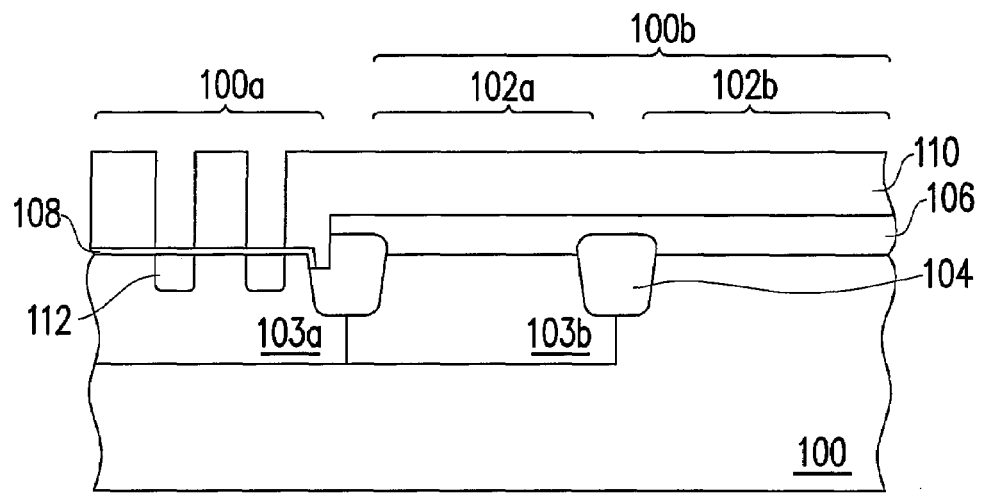

Continuing to FIG. 1D, a patterned mask layer 110 is formed over the substrate 100 of the memory array area 100a and the peripheral circuit area 10b. The patterned mask layer 110 conceals the peripheral circuit area 100b and a portion of the memory array area 100a. An ion implantation process is then performed to implant dopants into the substrate 100 exposed by the patterned mask layer 110 to form a plurality of buried bit lines 112 in the substrate 100.

Figure 1E:
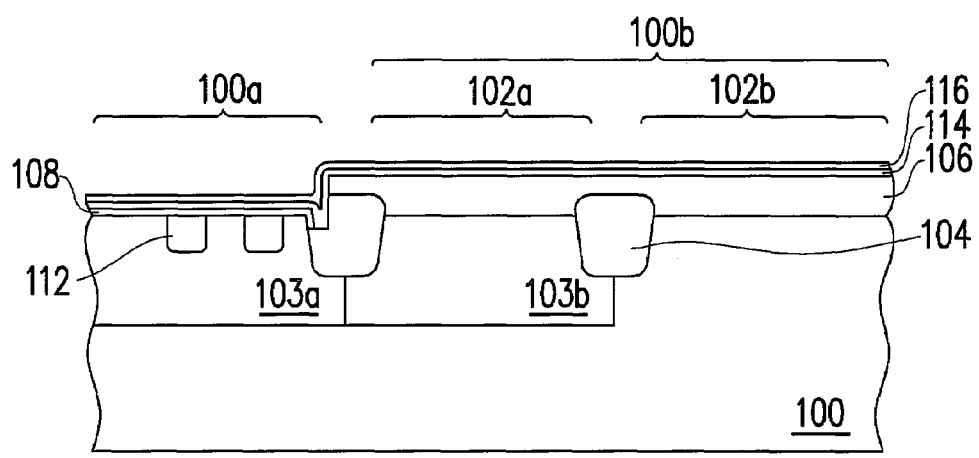

Now referring to FIG. 1E, the patterned mask layer 110 is removed. Then, a dielectric layer 114 and an insulating film 116 are sequentially formed over the insulating film 108 in the memory array area 100a and the insulating film 106 in the peripheral circuit area 100b. A material that constitutes the dielectric layer 114 includes nitrides, but also may include, for example but not limited to oxynitride, hafnium oxide, aluminate oxide, the silicate thereof or other materials having similar properties. The insulating film 116 is, for example, an oxide layer. The dielectric layer 114 and the insulating film 116 are respectively formed by deposition methods including but not limited to, for example, low pressure chemical vapor deposition (LPCVD) at a temperature ranging from 600 to 800 degrees Celsius. In one embodiment, the dielectric layer 114 and the insulating film 116 serve as a charge storage layer and an inter-gate dielectric film, respectively, and the insulating film 108, the dielectric layer 114 and the insulating film 116 together form a charge-trapping medium of the memory.

Figure 1F:
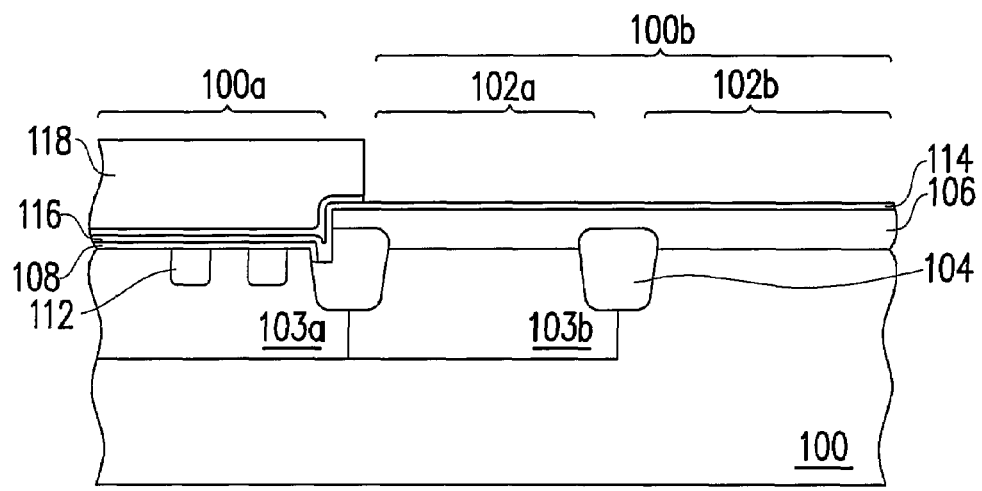

Continuing to FIG. 1F, a patterned mask layer 118 is formed concealing the memory array area 100a while exposing the peripheral circuit area 100b. Using the patterned mask layer 118 as an etching mask, the insulating film 116 in peripheral circuit area 100b is removed via wet etching, for example. The etchant used in the process includes but not limited to diluted hydrofluoric acid or BOE (buffer oxide etchant).

Figure 1G:
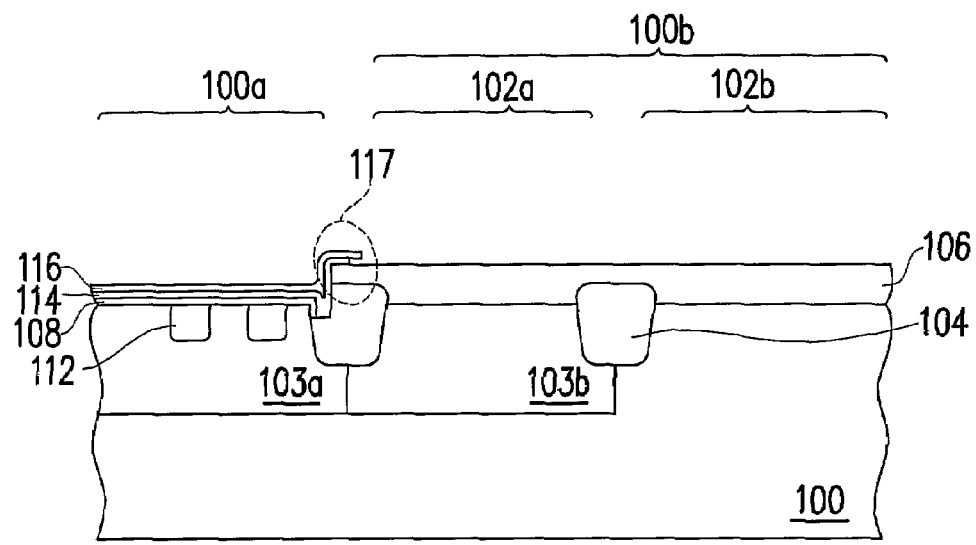

Subsequent to the removal of the insulating film 116 in the peripheral circuit area 100b, the patterned mask layer 118 is removed as shown in FIG. 1G. Thereafter, the dielectric layer 114 in the peripheral circuit area 100b is selectively removed. The removal of the dielectric layer 114 is accomplished by wet etching using hot phosphoric acid as an etchant, for example. Since the dielectric layer 114 in the memory array area is protected by the insulating film 116, the dielectric layer 114 in the memory array area is prevented from being etched. Further, an undercut 117 of the dielectric layer 114 is formed under the insulating film 116 at the boundary between the memory array area 100a and the peripheral circuit area 100b.

Figure 1H:
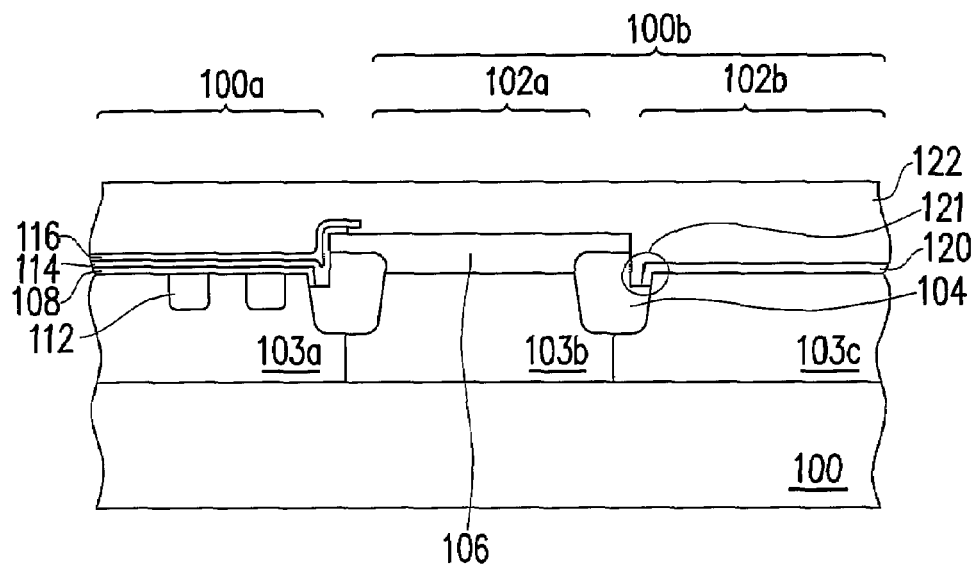

Referring to FIG. 1H, dopants are implanted in the substrate 100 of the low voltage device region 102b in the peripheral circuit area 100b to form a well 103c in the low voltage device region 102b. Thereafter, the insulating film 106 in low voltage device region 102b is removed, followed by forming an insulating film 120 on the substrate 100 in the low voltage device region 102b. The insulating film 106 is removed by wet etching methods, for example. The removal of the insulating film 106 in the low voltage device region 102b results with a notch 121 formed at the top edge surface of the isolation structure 104 configured between the low voltage device region 102b and the high voltage device region 102a. The insulating film 120 is an oxide layer formed to a thickness of about 15 to 75 angstroms, for example. The insulating film 120 is formed by growing in an oxidation furnace, for example. In one embodiment, the insulating film 120 serves as a gate dielectric film of the low voltage devices. In one embodiment, the insulating film 106 in the high voltage device region 102a may concurrently provide with an additional thickness. Subsequent to the formation of the insulating film 120, a polysilicon layer 122 is formed over both the memory array area 100a and the peripheral circuit area 100b.

It should be understood that the fabrication of the non-volatile memory is subsequently completed by resorting to known techniques and thus will not be reiterated herein.

Figure 2:
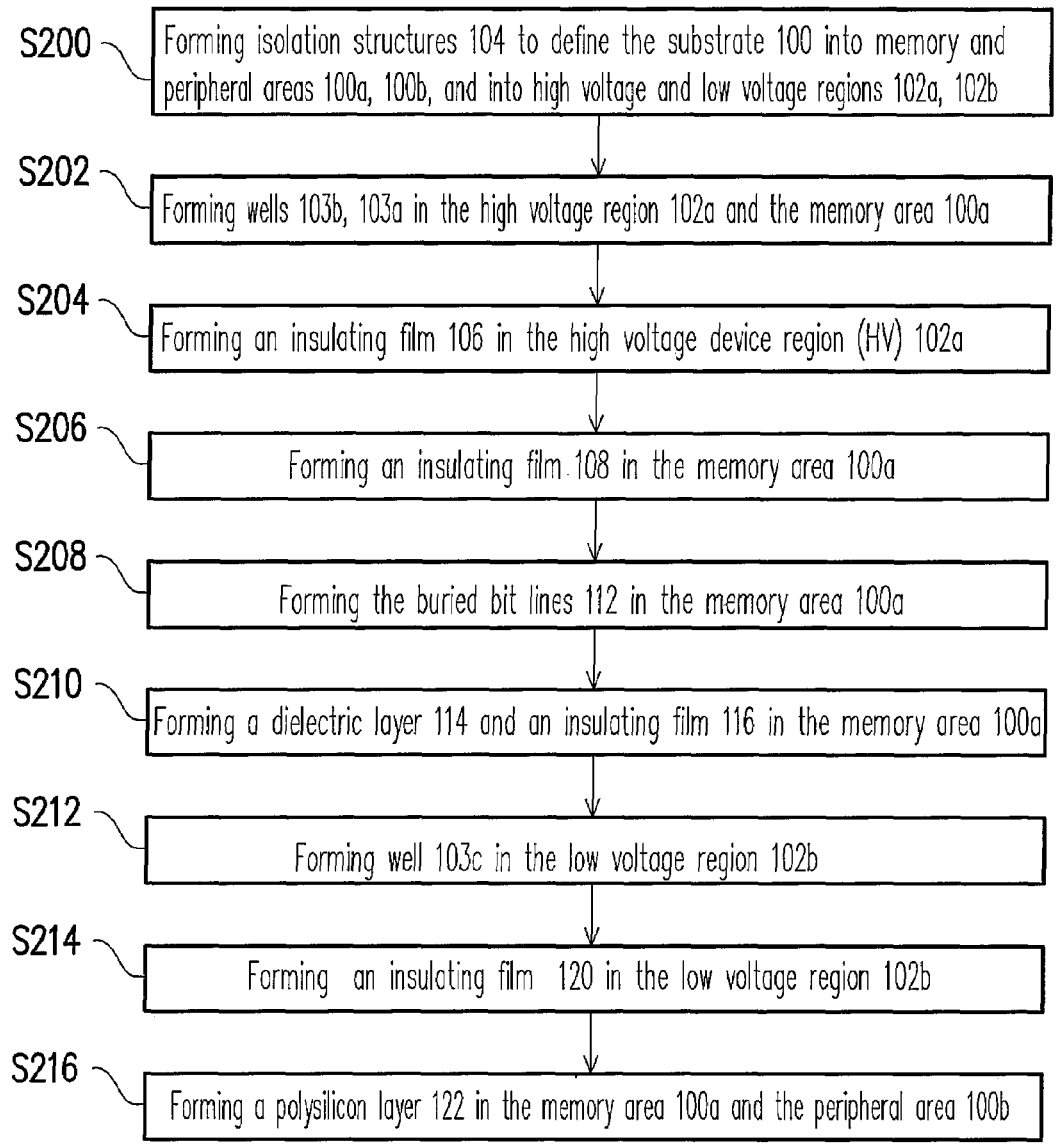
FIG. 2 is a flow chart of steps in exemplary processes that may be used in the fabrication of a non-volatile memory comprising a memory array area and a peripheral circuit array according to one embodiment of the present invention.

FIG. 2 is a flow chart of steps in exemplary processes that may be used in the fabrication of a memory comprising a memory array area and a peripheral circuit area according to one embodiment of the present invention. The same reference numbers are used in the flow chart shown in FIG. 2 and in the description illustrated by FIGS. 1A-1H to refer to the same or like parts.

First considering step S200 in FIG. 2, isolation structures 104 are formed to divide a semiconductor substrate 100 into a memory array area 100a and a peripheral circuit area 100b and to further divide the peripheral circuit area 100b into at least a high voltage (HV) device region 102a and a low voltage (LV) device region 102b. Wells 103b, 103a are respectively formed in the high voltage device region 102a and the memory array area 100a in step S202. Thereafter, an insulating film 106 is formed in the high voltage device region (HV) 102a in step S204. In step S206, an insulating layer 108 is formed in the memory array area 100a. Then, a plurality of buried bit lines 112 is formed in the substrate 100 in the memory array area 100a in step S208. After this, a dielectric layer 114 and an insulating film 116 are sequentially formed in the memory array area 100a in step S210. Continuing to step S212, well 103c is formed in the low voltage device region 102b. Then, an insulating film 120 is formed on the substrate 100 in the low voltage device region 102b in step 214. Ultimately, a polysilicon layer 122 is formed over the memory array area 100a and the peripheral circuit area 100b in step S216.

In the invention, the buried diffusion region is formed subsequent to the formation of the gate dielectric film of the high voltage device devices. The buried diffusion region is thus prevented from being affected by the thermal process used in forming the gate insulating film. In other words, the buried diffusion region is prevented from unwanted expansion due to the high thermal budget process used in forming the thick gate dielectric film of the high voltage devices in the peripheral circuit area. Accordingly, even the size of the memory cell is further reduced, the short channel effect is minimized. Moreover, the device characteristics of the memory can be better controlled.

Additionally, in the present invention, the gate dielectric film of the low voltage devices is formed after the formations of the charge trapping medium and the buried drain lines in the memory array area. Accordingly, the quality of gate dielectric film of the low voltage devices is not compromised by being exposed to the other process steps in the fabrication of the memory. For example, the gate dielectric film of the low voltage devices can be prevented from being damaged by etchants used in the removal of dielectric layer 114 and the insulating film 116 in the periphery circuit area. As a result, defects are less likely to be induced to the gate dielectric film of the low voltage devices. Moreover, since the well region in the low voltage device region is formed after the charge trapping medium and the buried drain lines in the memory array area are completed, the well junction in the low voltage device region is well defined. In essence, the quality and the property of the low voltage devices can be better preserved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating a non-volatile memory comprising a memory region and a peripheral circuit region separated by a first isolation structure, and the peripheral circuit region comprising at least a high voltage (HV) device region and a low voltage (LV) device region separated by a second isolation structure, wherein the method comprising:

forming a first insulating layer over a substrate in the high voltage device region;

forming a second insulating layer over the substrate in the memory region;

forming a plurality of buried diffusion regions in the substrate of the memory region;

forming sequentially a third insulating layer and a fourth insulating layer over the substrate of the memory region; and forming a fifth insulating layer over the substrate in the low voltage device region.

2. The method of claim 1, wherein the first insulating layer is also formed over the substrate of the memory region and the low voltage device region.

3. The method of claim 2, wherein before the step of forming the second insulating layer over the substrate in the memory region, the first insulating layer in the memory region is removed.

4. The method of claim 3, wherein a first notch is formed in a top surface of the first isolation structure.

5. The method of claim 2, wherein before the step of forming the fifth insulating layer with a second thickness over the substrate in the low voltage device region, the first insulating layer in the low voltage region is removed.

6. The method of claim 5, wherein a second notch is formed in a top surface of the second isolation structure.

7. The method of claim 1, wherein the third insulating layer and the fourth insulating layer are formed over the substrate of the memory region and the periphery circuit region.

8. The method of claim 7, wherein the third insulating layer and the fourth insulating layer in the periphery circuit region are subsequently removed before the step of forming the fifth insulating layer with the second thickness over the substrate.

9. The method of claim 8, wherein an undercut of the third insulting layer is formed under the fourth insulating layer.

10. The method of claim 8, wherein an etchant used in the step of removing the third insulating layer comprises hot phosphoric acid.

11. The method of claim 8, wherein an etchant used in the step of removing the fourth insulating layer comprises diluted hydrofluoric acid or BOE (buffer oxide etchant).

12. The method of claim 1, wherein before the step of forming the first insulating layer with a first thickness over the substrate in the high voltage device region, a first well and a second well are formed in the substrate of the memory region and the high voltage device region, respectively.

13. The method of claim 1, wherein a third well is formed in the low voltage region before the step of forming the fifth insulating layer over the substrate in the low voltage device region.

14. The method of claim 1, wherein a material that constitutes the third insulating layer is selected from the group consisting of nitride, oxynitride, hafnium oxide, aluminate oxide and silicates thereof.

15. The method of claim 1, wherein a conductive layer is formed substantially after the step of forming the fifth insulating film.

16. A method for fabricating a memory comprising a memory area and a peripheral circuit area, wherein the method comprising:
    forming a first insulating layer with a first thickness over a first region of the peripheral circuit area;
    forming thereafter a buried bit line in the memory area after the step of forming a first insulating layer with a first thickness; and
    forming a second insulating layer with a second thickness over a second region of the peripheral circuit area after the step of forming the buried bit line in the memory area, wherein the second thickness is smaller than the first thickness.

17. The method of claim 16 further comprises forming a charge-trapping medium in the memory area before the step of forming the second insulating layer with the second thickness.

18. The method of claim 16, wherein a well of the second region is formed substantially before the step of forming the second insulating layer with the second thickness.

19. A method for fabricating a non-volatile memory, wherein the method comprising:
    forming a plurality of isolation structures to define a substrate into at least a memory area and a peripheral area, and to define the peripheral area into at least a high voltage region and a low voltage region;
    forming a first insulating layer over the substrate of the memory area and the peripheral area;
    selectively removing the first insulating layer in the memory area;
    forming a second insulating layer over the substrate in the memory area;
    forming a plurality of diffusion regions in the substrate of the memory area under the second insulating layer;
    forming sequentially a third and a fourth insulating layers over the second insulating layer in the memory area, and over the first insulating layer in peripheral area;
    selectively removing the fourth insulating layer in the peripheral area;
    selectively removing the third insulating layer in the peripheral area;
    removing the first insulating layer in the low voltage region to expose the substrate of the low voltage region;
    forming a fifth insulating layer over the exposed substrate of the low voltage region; and
    forming a conductive layer to cover the fifth insulating layer, the first insulating layer and the fourth insulating layer.

20. The method of claim 19, wherein a first well and a second well are respectively formed in the substrate of the memory area and the high voltage region before the step of forming the first insulating layer.

21. The method of claim 19, wherein a third well is formed in the low voltage region before the step of forming the fifth insulating layer over the substrate.

22. The method of claim 19, wherein a first notch is formed in the isolation structure configured between the memory area and the peripheral area when the first insulating layer in the memory area is removed.

23. The method of claim 19, wherein a second notch is formed in the isolation structure configured between the high voltage region and the low voltage region when the first insulating layer in the low voltage region is removed.

24. The method of claim 19, wherein an undercut of the third insulating layer is formed after the third and the fourth insulating layers are removed from the high voltage region and the low voltage region.

25. A method for fabricating a memory comprising a memory area and a peripheral circuit area, wherein the method comprising:
    forming a first insulating layer with a first thickness over a first region of the peripheral circuit area;
        forming a diffusion region line only in the memory area after the step of forming the first insulating layer;
        forming a stacked insulating layer in the memory area; and
            forming a second insulating layer with a second thickness over a second region of the peripheral circuit area after the step of forming the stacked insulating layer, wherein the second thickness is smaller than the first thickness.

* * * * *